United States Patent [19]

Einzinger et al.

[11] Patent Number: 4,730,228
[45] Date of Patent: Mar. 8, 1988

[54] OVERTEMPERATURE DETECTION OF POWER SEMICONDUCTOR COMPONENTS

[75] Inventors: Josef Einzinger, Unterschleissheim; Christine Fellinger, Unterhaching; Ludwig Leipold, Munich; Jenoe Tihanyi, Munich; Roland Weber, Munich, all of Fed. Rep. of Germany

[73] Assignee: Siemens Aktiengesellschaft, Berlin and Munich, Fed. Rep. of Germany

[21] Appl. No.: 886,577

[22] Filed: Jul. 16, 1986

[30] Foreign Application Priority Data

Mar. 21, 1986 [DE] Fed. Rep. of Germany ....... 3609713

[51] Int. Cl.$^4$ ............................................. H02H 5/04
[52] U.S. Cl. ...................................... 361/103; 357/28; 374/178; 323/907; 323/245; 307/310; 307/491
[58] Field of Search ................ 307/310, 491; 323/245, 323/907; 330/143, 272; 357/28; 361/103; 374/178

[56] References Cited

U.S. PATENT DOCUMENTS

| | | | |
|---|---|---|---|
| 4,028,564 | 6/1977 | Streit et al. | 307/310 |
| 4,329,701 | 5/1982 | Brenneman | 357/28 |
| 4,331,888 | 5/1982 | Yamauchi | 307/310 |
| 4,417,263 | 11/1983 | Matsuura | 357/28 X |
| 4,546,373 | 10/1985 | Todd et al. | 357/28 X |
| 4,602,207 | 7/1986 | Kim et al. | 323/907 X |
| 4,639,755 | 1/1987 | Masayaki et al. | 357/28 |
| 4,652,144 | 3/1987 | Günther et al. | 374/178 |

FOREIGN PATENT DOCUMENTS 0217620  4/1987  European Pat. Off. .

OTHER PUBLICATIONS

Schade, Jr., RCA Technical Notes, "Thermal Shutdown Circuitry", 3/1981, T.N. No. 1270.

Primary Examiner—A. D. Pellinen
Assistant Examiner—Howard L. Williams
Attorney, Agent, or Firm—Lawrence C. Edelman

[57] ABSTRACT

The temperature of the power semiconductor component is sensed by a bipolar transistor. The bipolar transistor is in series with a depletion mode MOSFET whose gate and source electrodes are connected together. The drain electrode is also connected to a threshold element. Normally, the FET has low impedance, so that at the input of the threshold element source potential, e.g. ground potential, is present. With current rising as a function of temperature, the current through the FET is limited to a constant, essentially temperature-independent value, and the potential at the input of the threshold element rises steeply. This condition is detected as an overtemperature signal.

11 Claims, 3 Drawing Figures

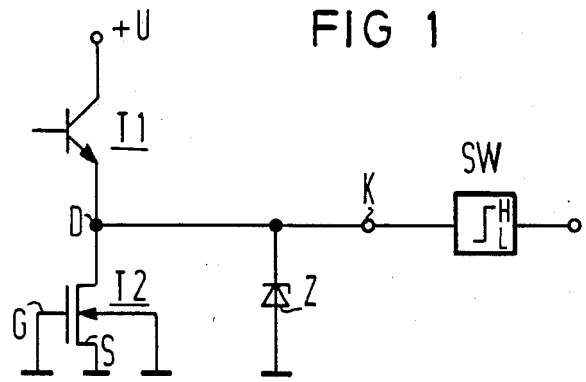
FIG 1
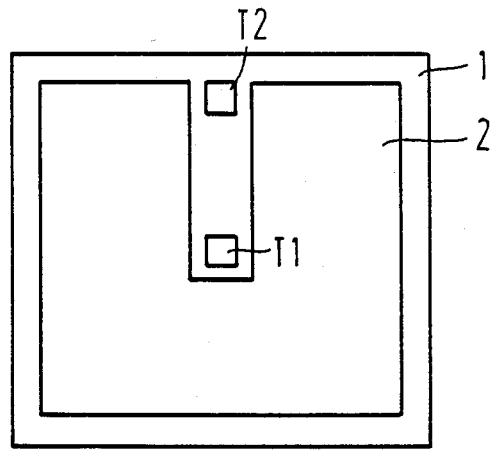
FIG 2
FIG 3

OVERTEMPERATURE DETECTION OF POWER SEMICONDUCTOR COMPONENTS

BACKGROUND OF THE INVENTION

1. Field of the Invention

The invention relates to a circuit arrangement using semiconductor elements with a temperature-dependent current/voltage characteristic for generating a signal when a critical temperature of a power semiconductor component is exceeded.

2. Description of the Prior Art

Such a circuit arrangement has been described e.g. in the German journal "elektronik industrie" 4–1985, pages 32–38. In this circuit arrangement, so-called "band gap" references are used for temperature sensing. The temperature-dependent forward voltage of one or more diodes is evaluated by means of a thermally-stable operational amplifier. Thus a voltage signal corresponding to the temperature is obtained, which signal is processed by a comparator for further treatment e.g. in a logic circuit. This circuit arrangement is relatively costly, in particular due to the requirement of a thermally-stable operational amplifier.

SUMMARY OF INVENTION

It is an object of the invention to design a circuit arrangement of the above-mentioned kind in which a signal that indicates when a critical temperature has been exceeded can be obtained in a much simpler manner.

In accordance with the invention, this problem is solved by using a bipolar transistor in thermal contact with the power semiconductor component, by a current source in series with the bipolar transistor, one terminal of the current source being connected to the emitter electrode of the bipolar transistor, and by a threshold element whose input is also connected to the emitter electrode of the bipolar transistor.

Other features and advantages of the invention will be apparent from the following description of the preferred embodiment, and from the claims.

For a fuller understanding of the present invention, reference should now be made to the detailed description of preferred embodiment of the invention and to the accompanying drawings.

BRIEF DESCRIPTION OF THE DRAWING

FIG. 1 illustrates an overtemperature detection circuit arrangement constructed in accordance with the principles of the invention;

FIG. 2 illustrates the current/voltage characteristic of a depletion mode MOSFET; and FIG. 3 illustrates a spatial arrangement of a bipolar transistor and of a depletion mode MOSFET on the power semiconductor component.

DETAILED DESCRIPTION OF THE DRAWINGS

The circuit arrangement of FIG. 1 contains a bipolar transistor T 1 which is in series with the source-drain path of a depletion mode MOSFET T 2. Bipolar transistor T 1 has an open base connection and is in thermal contact with a power semiconductor component (not shown) whose temperature is to be monitored. MOSFET T 2 has a gate electrode G which is electrically connected with its source electrode S. The drain electrode D is connected with the emitter electrode of transistor T 1 and the collector electrode of transistor T 1 is connected to a voltage $+U$. An input terminal K of a threshold element SW is connected to the drain of MOSFET T 2 and the emitter of transistor T 1.

In the illustrated embodiment, transistor T 1 is an npn transistor, while MOSFET T 2 is and n-channel depletion mode MOSFET. If the circuit arrangement is to be laid out for negative voltage $-U$, one would use as transistor T 1 a pnp transistor and as MOSFET T 2 a p-channel depletion mode MOSFET.

When a voltage is applied, if the circuit arrangement is at room temperature, an off-state current flows through transistor T 1. This off-state current traverses the depletion mode MOSFET T 2. T 2 receives the gate-source voltage $U_{GS}=0$ V and operates in the flat portion of the current/voltage characteristic illustrated in FIG. 2. It acts as a current source and is dimensioned so that its current demand is greater than the off-state current flowing through transistor T 1 at room temperature. For this smaller current, MOSFET T 2 forms a small resistance, so that approximately ground potential is present at the drain electrode D of MOSFET T 2 and hence at input terminal K. This voltage is sensed by the treshold element SW which supplies a signal L.

When the temperature of the power semiconductor component (and hence that of T 1 due to its thermal connection) rises, the off-state current through transistor T 1 rises steeply, multiplied by its current amplification factor beta according to an exponential function. This rise is very steep, especially when, as in the embodiment, the base electrode connection of transistor T 1 is open. In principle, however, the base electrode may also be connected to other components. When the current reaches the level of the current which is demanded by MOSFET T 2, the internal resistance of MOSFET T 2 increases sharply and MOSFET T 2 takes up voltage. Thereby, the potential at drain electrode D increases abruptly to a value clearly different from ground potential and which is between ground potential and $+U$.

For protection of the input of threshold element SW and a possibly following logic circuit (not shown), there is inserted between terminal K and ground a Zener diode Z which limits the input voltage of threshold element SW to, for example, 6 V. The threshold voltage of threshold elements SW is e.g. one half the Zener voltage, that is, e.g. 3 V. Over-stepping of the threshold voltage is indicated by signal H.

To establish the reversal point, depletion mode MOSFET T 2 is dimensioned so that at the temperature at which reversal is to take place, i.e. at which signal H is to be indicated, it demands a current which is as great as the current which transistor T 1 carries at this temperature.

The reversal point can be defined quite precisely, because, as has been mentioned, the off-state current of transistor T 1 increases, multiplied by beta according to an exponential function, dependent upon temperature, while the current demand from MOSFET T 2 is much less temperature-dependent. By appropriate selection of the channel length of MOSFET T 2 it can be achieved moreover that the temperature dependence of the starting voltage is compensated with that of the carrier mobility. In this manner the current through MOSFET T 2 becomes temperature-independent.

It is expedient to place bipolar transistor T 1 on that point of the power semiconductor element at which a critical temperature first occurs. This point is the center of the power semiconductor element, as shown in FIG. 3. Here, the chip of the power semiconductor element is marked 1 and the active surface is marked 2. Transistor T 1 is shown seated in a recess of active surface 2. Depletion MODE MOSFET T 2 can also be integrated on chip 1 and is appropriately seated at a point away from the center of active surface 2, for example at the edge of chip 1.

Thus, there has been shown and described novel apparatus for detecting over temperature of a power semiconductor device which fulfills all the objects and avantages sought therefore. Many changes, modifications, variations and other uses and applications of the subject invention will, however, become apparent to those skilled in the art after considering this specification and the accompanying drawings which disclose a preferred embodimen thereof. For example, as previously noted, if a negative operating voltage were to be used, transistor T 1 would be PNP and MOSFET T 2 would be of p-channel type. Furthermore, the current source may also be formed by an enhancement MODE FET, to which a defined gate-source voltage is supplied, or it may be constructed in some other form. Additionally the circuit arrangement of the invention can be used for monitoring objects other than power semiconductor elements for elevated temperature. All such changes, modifications, variations and other uses and applications which do not depart from the spirit and scope of the invention are deemed to be covered by the invention which is limited only by the claims which follow.

What is claimed is:

1. In a circuit arrangement for the generation of a signal when a critical temperature in a power semiconductor component is exceeded, said circuit arrangement using semiconductor components with temperature-dependent current/voltage characteristics, the improvement comprising:
   a bipolar transistor (T 1) in thermal contact with the power semiconductor component and having a temperature dependent leakage current flowing therethrough;
   a current source connected in series with said bipolar transistor, said current source having a current demand which is greater than said leakage current of said bipolar transistor at a given temperature which is less than said critical temperature; and
   a threshold element having an input connected to the emitter electrode of said bipolar transistor and an output which provides said signal when said critical temperature is exceeded.

2. A circuit arrangement according to claim 1, wherein:
   said current source is a depletion mode FET, the source and gate electrodes of which are connected to each other and whose drain electrode is connected to the emitter electrode of said bipolar transistor.

3. A circuit arrangement according to claim 2, wherein:
   at least one Zener diode is connected between the input terminal of the threshold element and a source of ground potential.

4. A circuit arrangement according to claim 2 wherein:
   said bipolar transistor is disposed at least approximately in the center of a surface of said power semiconductor component.

5. A circuit arrangement according to claim 1, characterized in that the base connection of said bipolar transistor is open.

6. A circuit arrangement according to claim 5 wherein:
   said bipolar transistor is disposed at least approximately in the center of a surface of said power semiconductor component.

7. A circuit arrangement according to claim 1, wherein:
   at least one Zener diode is connected between the input terminal of the threshold element and a source of ground potential.

8. A circuit arrangement according to claim 7 wherein:
   said bipolar transistor is disposed at least approximately in the center of a surface of said power semiconductor component.

9. A circuit arrangement according to claim 1 wherein:
   said bipolar transistor is disposed at least approximately in the center of a surface of said power semiconductor component.

10. A circuit arrangement according to claim 9 wherein:
    said current source is integrated into said power semiconductor component and is disposed at its edge.

11. A circuit arrangement according to claim 1 wherein:
    said current source is integrated into said power semiconductor component and is disposed at its edge.

* * * * *